United States Patent [19]
Taft

[11] Patent Number: 6,046,612
[45] Date of Patent: Apr. 4, 2000

[54] SELF-RESETTING COMPARATOR CIRCUIT AND METHOD

[75] Inventor: Robert Callaghan Taft, Munich, Germany

[73] Assignee: National Semiconductor Corporation, Santa Clara, Calif.

[21] Appl. No.: 09/123,191

[22] Filed: Jul. 27, 1998

[51] Int. Cl.[7] .............................. H03K 5/22; G11C 27/02
[52] U.S. Cl. .................................. 327/77; 327/337; 327/94
[58] Field of Search ............................. 330/9; 327/51–57, 327/65–67, 77, 89, 91–96, 337, 554, 560–563, 143, 198

[56] References Cited

U.S. PATENT DOCUMENTS

| | | | |
|---|---|---|---|
| 5,391,999 | 2/1995 | Early et al. ................................ | 327/337 |
| 5,410,270 | 4/1995 | Rybicki et al. .............................. | 330/9 |
| 5,481,500 | 1/1996 | Reohr et al. ............................... | 365/203 |
| 5,592,168 | 1/1997 | Liao .......................................... | 341/167 |
| 5,635,864 | 6/1997 | Jones ......................................... | 327/77 |
| 5,821,780 | 10/1998 | Hasegawa ................................. | 327/63 |
| 5,831,562 | 11/1998 | Van Auken et al. ....................... | 327/94 |

*Primary Examiner*—Toan Tran
*Attorney, Agent, or Firm*—Limbach & Limbach L.L.P.

[57] ABSTRACT

A comparator circuit and method for comparing first and second inputs. First and second input capacitors are provided for storing first and second voltages indicative of the first and second inputs when the circuit is in a sample phase. A comparator stage coupled to the first and second input capacitors switches from a measure state to one of first and second output states when the comparator circuit is in a hold phase based upon the relative magnitudes of the first and second inputs. Reset circuitry operates to discharge the input capacitors when the comparator stage switches to one of the output states. During a subsequent sample phase, the discharged input capacitors can be rapidly charged to new voltages thereby increasing the operating speed of the comparator circuit.

21 Claims, 4 Drawing Sheets

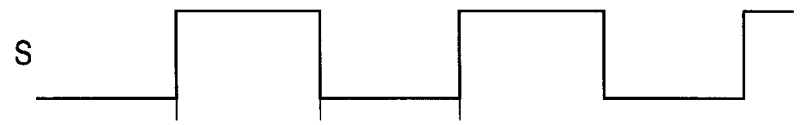
FIG. 2A
(PRIOR ART)
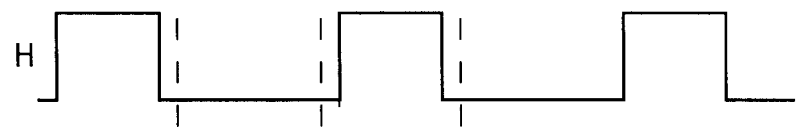
FIG. 2B
(PRIOR ART)
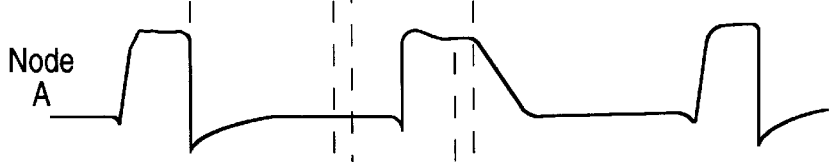
FIG. 2C
(PRIOR ART)
FIG. 2D
(PRIOR ART)
FIG. 2E
(PRIOR ART)
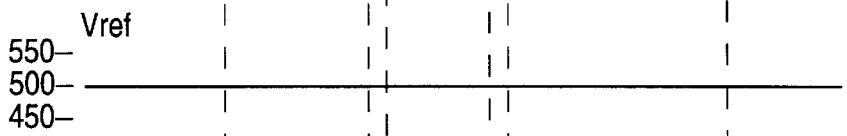
FIG. 2F
(PRIOR ART)
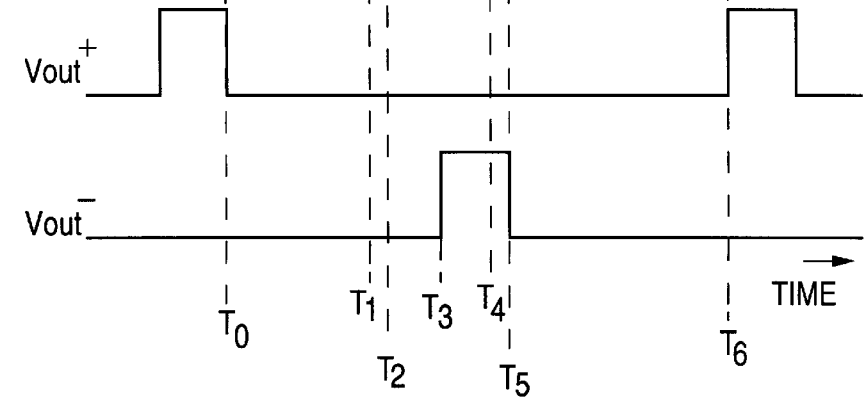
FIG. 2G
(PRIOR ART)
FIG. 2H
(PRIOR ART)

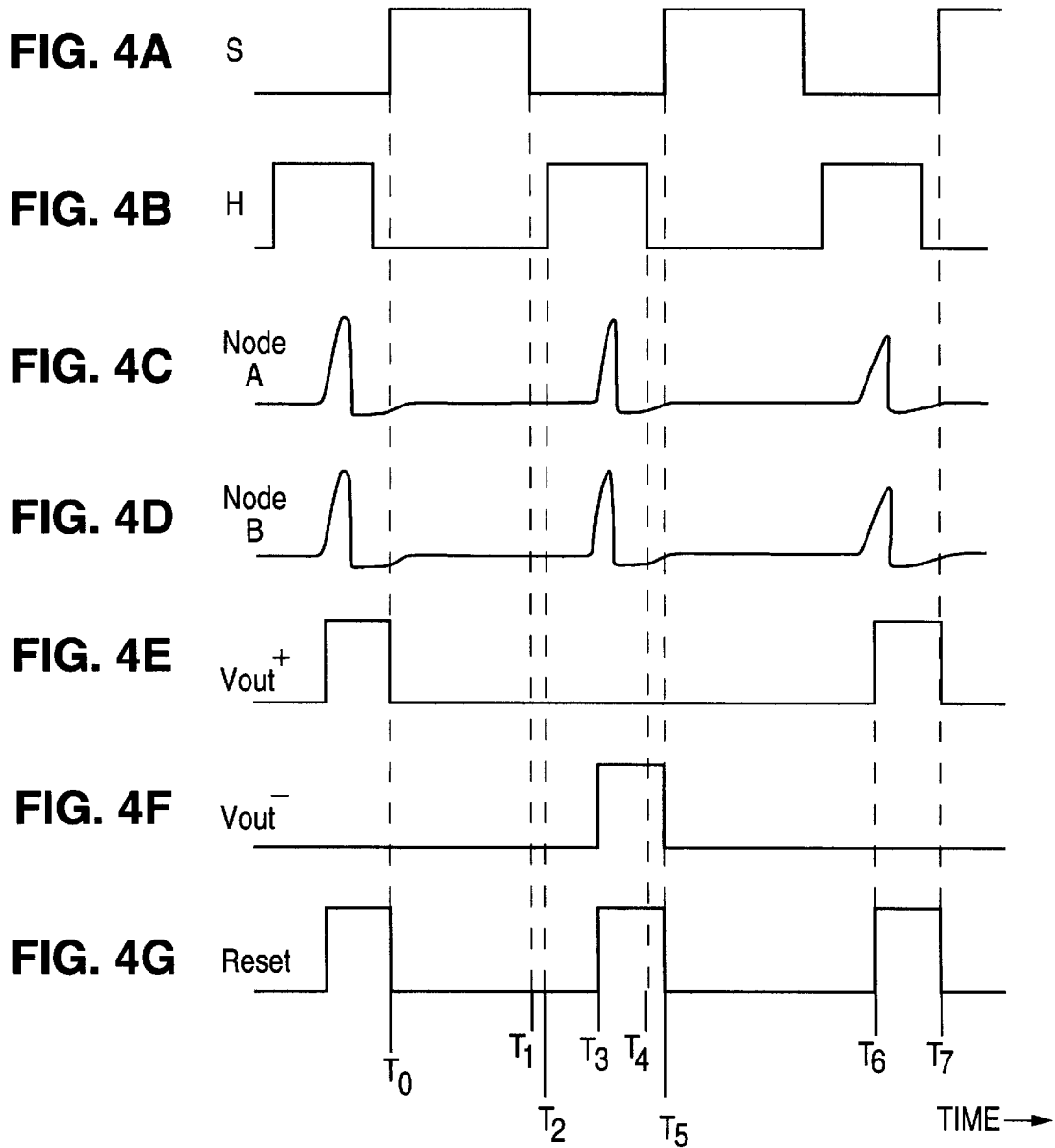

SELF-RESETTING COMPARATOR CIRCUIT AND METHOD

BACKGROUND OF THE INVENTION

1. Field of the Invention

The present invention relates generally to comparator circuits and in particular to high speed integrated circuit comparator circuits.

2. Description of Related Art

Comparator circuits are frequently employed in Analog-To-Digital (ADC) circuits and other types of data conversion devices. FIG. 1 is a schematic diagram of a conventional auto-zeroing capacitively coupled comparator circuit, generally designated by the numeral 10, which can be implemented in integrated circuit form and is frequently used in ADC circuits. The comparator circuit 10 includes a first input Vin and a second input Vref, both of which are positive voltages for single supply operation. Typically, Vin is an analog input which is to be compared with a fixed reference voltage, such as Vref. Inputs Vin and Vref are buffered by non-inverting amplifiers 12 and 14, respectively.

Comparator circuit 10 includes two compare amplifiers 16 and 18 which are connected together in a cross-coupled configuration. The output of amplifier 16 is connected to the input of amplifier 18 by way of a first feedback capacitor 20 and the output of amplifier 18 is connected to the input of amplifier 16 by way of a second feedback capacitor 22 equal in value to capacitor 20. Amplifiers 16 and 18 receive inputs through a pair of equal value input capacitors 24 and 26, respectively. The input capacitors 24 and 26 are typically two times larger in value than the feedback capacitors 20 and 22.

The outputs of the cross-coupled amplifiers 16 and 18 are connected to an output latch circuit which includes input NMOS transistors 28 and 30 and pull-up PMOS transistors 32 and 34. The common drain connection of transistors 28 and 32 is connected to the gate of transistor 34 and the common drain connection of transistors 30 and 34 being connected to the gate of transistor 32. The output latch includes first and second output buffers 40 and 42 having respective inputs connected to the common drain connection of transistors 28 and 32 and the common drain connection of transistors 30 and 34, respectively. The outputs of buffers 40 and 42 form the outputs Vout⁻ and Vout⁺, respectively, of the comparator circuit 10.

The operation of comparator circuit 14 is controlled by a pair of non-overlapping clock signals S (sample) and H (hold). FIGS. 2A and 2B are timing diagrams which represent signals S and H, respectively. At time $T_0$, the hold signal H is low and sample signal S goes high thereby indicting that the comparator circuit is in the sample phase of operation. (Note that the timing diagram is not to scale with respect to either the magnitude axis or the time axis.) Under these conditions, transistor switch 44 is conductive so that input Vin will be applied to one terminal of input capacitor 24 by way of unity gain amplifier 12. Similarly, transistor switch 46 is conductive so that input Vref will be applied to one terminal of input capacitor 26 by way of unity gain amplifier 14. The low hold signal H will cause transistor switch 48 to be off.

The inverted signal $\overline{H}$, which is high at this time ($T_0$), is applied to transistor switches 50 and 52 so that both switches will be conductive. Switch 50 will connect the input and output of compare amplifier 16 directly together. This will cause the input and output to be at the threshold voltage or virtual ground of amplifier 16, that typically being on the order of a fraction of a volt. Note that the compare amplifiers 16 and 18 need to be inverting for this threshold voltage or virtual ground to be established. Switch 52 performs a similar function in connection with compare amplifier 18. Under these conditions, input capacitor 24 will have a voltage drop equal to the difference between the input threshold voltage of amplifier 16 and input Vin. Similarly, input capacitor 26 will have a voltage drop equal to the difference between the input threshold voltage of amplifier 18 and input Vref assuming that the buffer amplifiers are ideal and perfectly reproduce Vin and Vref. In the present example, and as can be seen in FIGS. 2D and 2E (not to scale), input Vin is +550 mv during the first sample phase depicted in the timing diagram and is thus slightly larger than the fixed reference voltage Vref of +500 mv.

During the sample phase, the output latch is placed in a disable state by control transistors 36 and 38, both of which are larger than pull-down transistors 28 and 30. Since inverted signal $\overline{S}$ is low at this time, the PMOS transistors 36 and 38 will both be conductive thereby forcing the inputs to the buffer circuits to a high state so that both outputs Vout+ and Vout− will be low (inactive) as can be seen in FIGS. 2G and 2H. This is true regardless of the state of the smaller pull-down transistors 28 and 30 which, at this point, have gate voltages equal to the respective threshold voltages of amplifiers 16 and 18.

At time $T_1$, signal S goes low and, at a small time later, $T_2$, signal H goes high thereby causing the comparator circuit 14 to enter the hold phase. The low signal S will first turn off switches 44 and 46 thereby isolating the input capacitors 24 and 26 from the outputs of amplifiers 12 and 14. Further, control transistors 36 and 38 will turn off since signal $\overline{S}$ is high so that the output latch will be operative and will tend to be in a neutral state so that there will be little preference for the output latch to switch to one state over another state. Thus, the output latch is in condition to be set to either output state, Vout⁺ active or Vout⁻ active, in response to the relatively weak outputs of the compare amplifiers 16 and 18. The subsequent increase in signal H at time $T_2$ will result in the input terminals of input capacitors 24 and 26 being connected together and the switches 50 and 52 being opened thereby removing the connection between the input and output of compare amplifiers 16 and 18.

Connecting the input terminals of the input capacitors 24 and 26 together will cause the two capacitors to be connected in series between the inputs of the compare amplifiers 16 and 18. The total voltage drop across the series connection of the two capacitors will be substantially equal in magnitude to the difference in Vin and Vref. This assumes that the input capacitors 24 and 26 are significantly larger than the capacitances due to wiring, amplifier inputs and other parasitics. The polarity of the drop across the capacitors will be such that the input of amplifier 16 will be reduced below the threshold voltage of amplifier 16 by an amount equal to approximately one-half of the voltage difference and the input of amplifier 18 will be increased above the threshold voltage of amplifier 18 by an amount equal to approximately one-half the voltage difference. The drop in input voltage to amplifier 16 will be amplified and inverted by the amplifier. The rise in output voltage of amplifier 16 is capacitively coupled to the input of amplifier 18 thereby reinforcing the increase in voltage applied to the input of amplifier 18. The resultant drop in the output of amplifier 18 is capacitively coupled to the input of amplifier 16 thereby reinforcing the drop in voltage applied to the amplifier input. This regenerative action causes the compare amplifiers 16 and 18 to exhibit a large amount of closed loop gain, much greater than the open loop gain of the individual amplifiers. It can be further appreciated that any difference between input threshold voltage of the two amplifiers 16 and 18 is compensated for automatically.

At this point in time, $T_3$, the output of compare amplifier 18 will begin rapidly decreasing in value and the output of compare amplifier 16 will begin increasing rapidly. Eventually, the regenerative action provided by the cross-coupled feedback capacitors 20 and 22 will cause either transistor 28 to start to turn on or transistor 30 to start to turn off or a combination of both. The resultant drop in the drain voltage of transistor 28 will cause transistor 34 to begin to turn on and the resultant increase in drain voltage of transistor 30 will cause transistor 32 to begin to turn off. Eventually, this regenerative action will cause the output latch to rapidly switch to a state so that output Vout⁺ is active ($V_{CC}$) and Vout⁻ is inactive ($V_{SS}$) at time $T_3$. Thus, it can be seen that the output latch provides a comparison function and a level shifting function by detecting the relative magnitudes of the outputs of compare amplifiers 16 and 18 and by providing outputs Vout⁺ and Vout⁻ at standard CMOS levels. The input comparator stage, which includes compare amplifiers 16 and 18 and associated circuitry, can be considered to be in a measure state during the hold phase just prior to time $T_3$ and to be in one of two possible output states after $T_3$. One output state will cause only Vout⁺ to be active and the other output state will cause only Vout⁺ to be active.

In a second exemplary compare operation, starting at time $T_4$, Vin will have dropped from 550 mv to 450 mv so that Vin is now 100 mv less than Vref. The operation of the comparator circuit 14 is similar to that previously described except that Vout⁺ will go active (high) at time $T_6$. Vout⁺ will remain inactive.

The above-described comparator circuit 14 provides satisfactory operation at normal operating speeds. However, as the speed requirements of ADCs and other similar circuits using comparators increases, comparator circuit 14 has been found to be inadequate.

There is a need for comparator circuits having improved high frequency operating characteristics. The comparator circuit in accordance with the present invention provides such improved operating characteristics and can be easily implemented in integrated circuit form. These and other advantages of the present invention will become apparent to those skilled in the art upon a reading of the following Detailed Description of the Invention together with the drawings.

BRIEF DESCRIPTION OF THE DRAWINGS

FIGS. 2A–2H are timing diagrams relating to the operation of the comparator circuit of FIG. 1.

FIGS. 4A–4G are timing diagrams relating to the operation of the comparator circuit of FIG. 3.

SUMMARY OF THE INVENTION

A comparator circuit and method of operating a comparator circuit are disclosed for comparing first and second input signals. The comparator circuit includes first and second input capacitors which are connected so as to store first and second voltages indicative of the respective first and second inputs when the comparator circuit is in a sample phase. The comparator circuit further includes an input comparator stage coupled to the first and second input capacitors and configured to switch from a measure state to one of a first and second output states when the comparator circuit is a hold phase based upon the relative magnitudes of the first and second inputs.

Reset circuitry is further provided which is configured to discharge the first and second input capacitors in response to the input comparator stage switching to one of the first and second output states. Thus, during subsequent sample phases, the first and second input capacitors can be rapidly charged to new first and second voltages thereby increasing the operating speed of the comparator circuit.

DETAILED DESCRIPTION OF THE INVENTION

Figure 1:
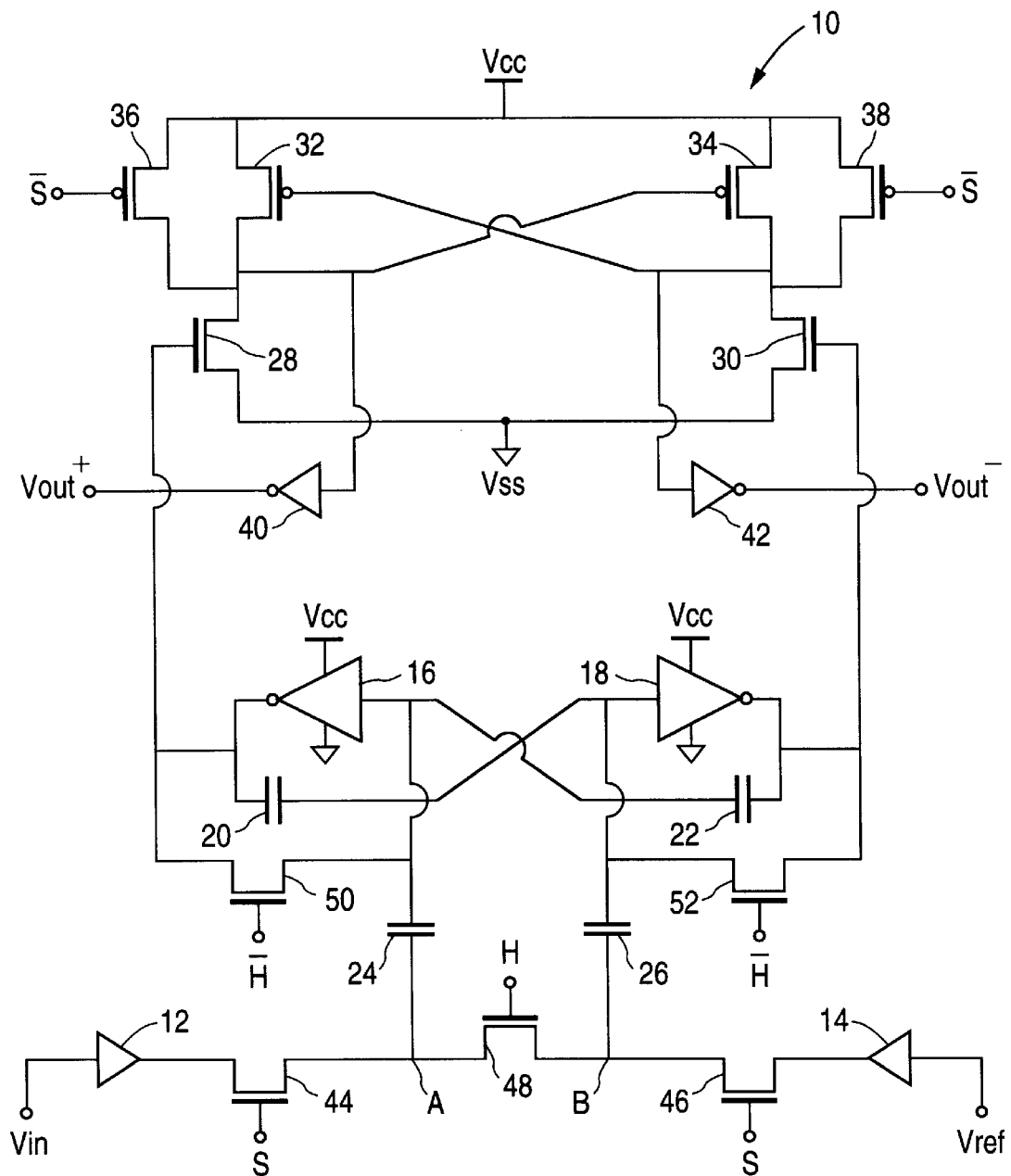
FIG. 1 is a schematic diagram of a conventional comparator circuit as is commonly used in Analog-To-Digital Converters.

Referring again to the prior art comparator circuit of FIG. 1, the voltages that appear at nodes A and B of the circuit are depicted in the FIG. 2C and 2D timing diagrams. At time $T_0$ for example, when transistor switches 44 and 46 are conductive, the nodes A and B are connected directly to the outputs of amplifiers 12 and 14, respectively. During the subsequent hold phase at time $T_1$, the transistor switches 44 and 46 function to isolate the input capacitors 24 and 26 from the amplifier 16 and 18 outputs and switch 48 then functions slightly later, at time $T_2$, to short the input terminals together. Thus, nodes A and B are at the same voltage, with that voltage changing rapidly at time $T_3$ due to the change in state of the input to the compare amplifiers 16 and 18. At the end of the hold phase at time $T_5$, input capacitors 24 and 26 will have a stored charge of opposite polarity. As similar remnant charge is present, for example, at time $T_0$. The size of the charge and the distribution of the charge between the two capacitors 24 and 26 will vary depending both upon the absolute difference in magnitude of the inputs Vin and Vref and the relative magnitudes of the outputs of compare amplifiers 16 and 18.

At the beginning of the sample phase, such as time $T_0$ or $T_5$ when switches 44 and 46 are first turned on, the input amplifiers 12 and 14 must alter the charge on the input capacitors 24 and 26 to correspond to that of inputs Vin and Vref. Since the amplifiers 12 and 14 have a finite output impedance, a significant amount of time will be required to alter the charge, particularly if the remanent charge is large and is of the opposite polarity of the desired charge. The nature of the potential error is compounded by the fact that the error is not random but is a function of whether Vout+ or Vout− was high at the end of the previous measurement. Thus, the duration of the sample phase (S) must be maintained at some minimum value to provide amplifiers 12 and 14 ample time to charge input capacitors 24 and 26 under worst case operating conditions. Accordingly, the maximum operating speed of the prior art comparator circuit 10 is significantly limited.

Figure 3:
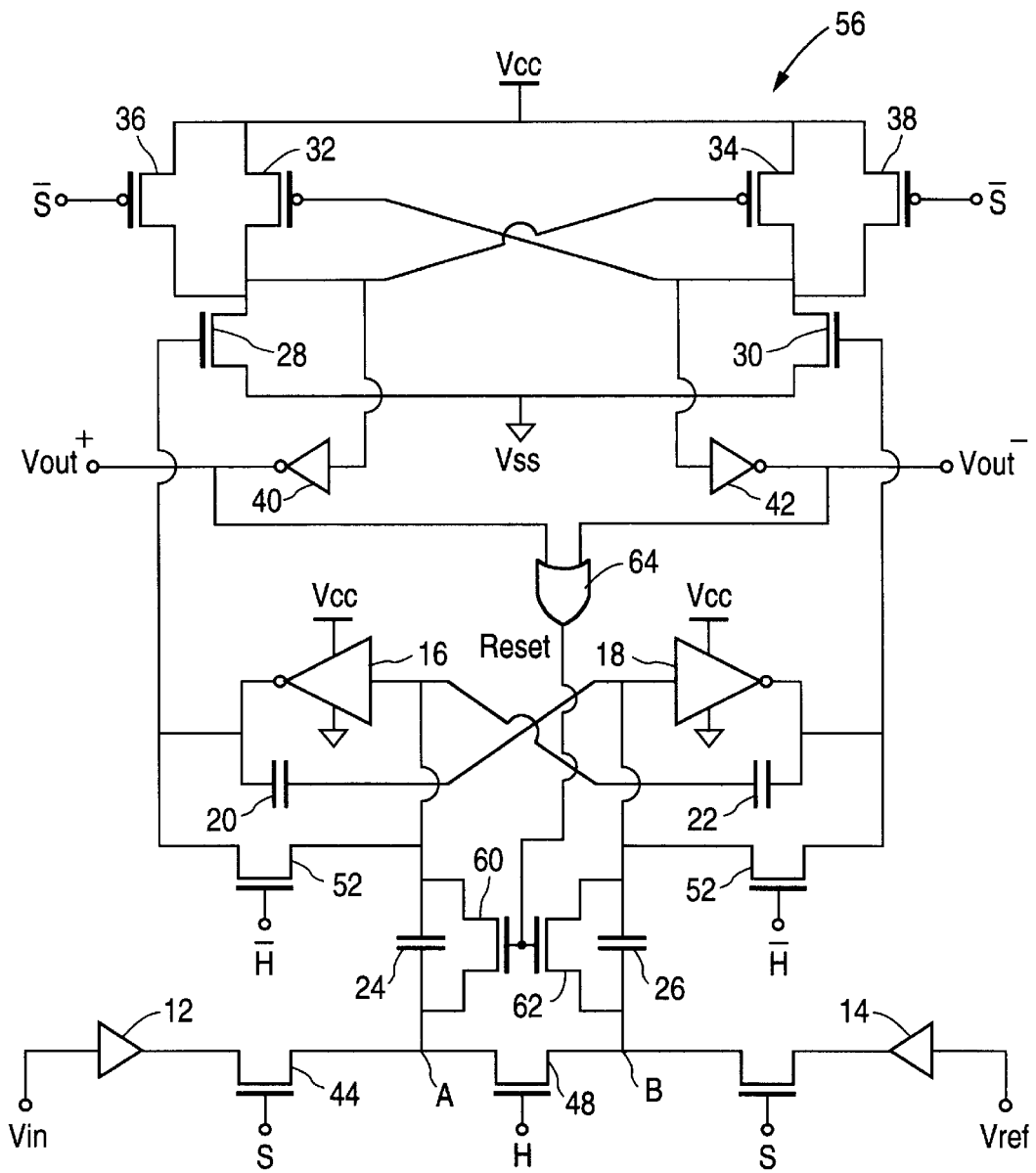
FIG. 3 is a schematic diagram of a comparator circuit in accordance with the present invention.

FIG. 3 is a schematic diagram of one embodiment of a comparator circuit 56 in accordance with the present invention. Much of the construction and operation of the FIG. 1 comparator circuit is the same as the prior art circuit, including the construction and operation of the output latch. FIGS. 4A, 4B, 4C, 4D, 4E, 4F and 4G are timing diagrams illustrating the operation of the FIG. 3 comparator circuit. The inputs Vin and Vref are not depicted but are the same as shown in the FIG. 2E and 2F timing diagrams.

The FIG. 3 circuit includes a pair of reset NMOS transistors 60 and 62. Transistor 60 is connected across input capacitor 24 and transistor 62 is connected across input capacitor 26. An OR gate 64 is provided having two inputs connected to Vout⁺ and Vin⁻, respectively, and produces an output which operates as an asynchronous Reset signal. The Reset signal is connected to the gates of transistors 60 and 62. During the hold phase when the output latch has been set, either Vout⁺ or Vout⁻ will become active (go high), at time T₃ for example, and will remain active until reset by inverted signal S̄ at which time, T₅ for example, both signals go inactive (low). At all other times, both signals are inactive. During the period that either Vout⁺ or Vout⁻ is high, the output Reset (FIG. 4G) of OR gate 64 is high thereby turning on both transistors 60 and 62 so as to effectively short input capacitors 24 and 26. This will cause both input capacitors 24 and 26 to be rapidly discharged to 0 volts. Thus, substantially all of the remanent charge is removed. Accordingly, at the beginning of the sample phase, when signal S goes high, nodes A and B will be at the input threshold voltage of amplifiers 16 and 18, respectively, as indicated by FIGS. 4C and 4D at times T₀, T₅ and T₇. Since the input capacitors 24 and 26 are shorted subsequent to the point in time which the output latch has been set to the proper state, the removal of charge does not interfere with the operation of the comparator circuit 56.

Since it is possible to quickly charge the input capacitors 24 and 26 to the proper voltage during the sample phase, the sample phase duration can be reduced. Thus, a higher comparator circuit operating speed is achieved. Further, the requirement of having a separate reset phase, in addition to the sample and hold phases, is avoided. Note also that when a large overdrive condition occurs, where Vin is significantly larger or significantly smaller than Vref, the greater the remanent differential charge on the input capacitors 24 and 26. This requires a relatively large amount of time to discharge the capacitors after signal Reset goes high as compared to conditions where the overdrive is small or nonexistent. However, this increased time is offset by the fact that the large overdrive also causes the compare amplifiers 16 and 18 to more quickly change state, that is, switch from the measure state to one of the output states. Thus, the asynchronous Reset signal will be go high earlier than it would when overdrive is not present. Thus, a reduced sample phase duration can still be achieved.

It should be noted that improved operation is achieved by virtue of the fact that nodes A (FIG. 4C) and B (FIG. 4D) for Vin and Vref, respectively, have identical settling (both in duration and voltage) during the comparator sampling phase. Thus, minimal error will be introduced to Vin wrt. Vref during the comparator sampling phase, even before the settling is complete. In contrast, not only are the settling times of the prior art circuit (FIGS. 2C and 2D) longer, the settling of Vin wrt. Vref is opposite in voltage direction, and a function of the comparator's previous decision. Such a difference in settling between Vin and Vref of the prior art will therefore introduce a significant error during the comparator sampling phase until such time as complete settling has been achieved. Thus, a significant further advantage besides just reduced settling time of the invention is provided over the prior art circuit.

Figure 5:
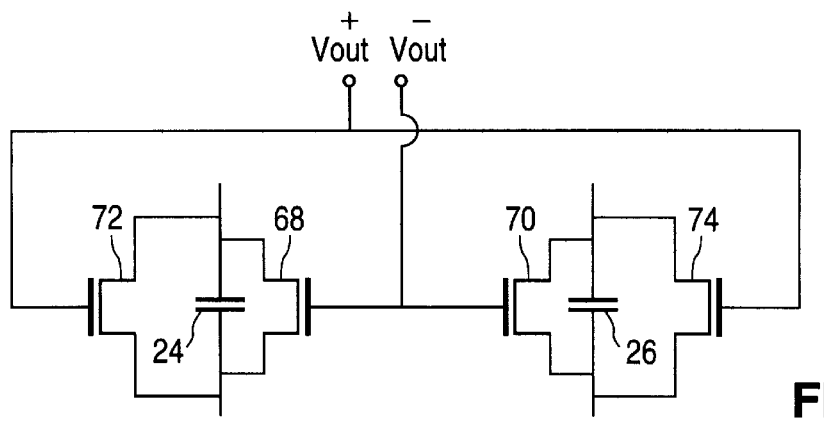
FIG. 5 is a schematic diagram of the input capacitor discharge circuit of a further embodiment of a comparator circuit is accordance with the present invention.

FIG. 5 shows an alternative embodiment of the subject invention which uses NMOS transistors 68, 70, 72 and 74 in lieu of the OR gate 64 of FIG. 3 and transistors 60 and 62. When output Vout⁺ goes high (active), Vout⁻ will be low (inactive) so that transistors 72 and 74 are turned on thereby shorting capacitors 24 and 26. Similarly, when output Vout⁻ goes high (active), Vout⁺ is inactive and transistors 68 and 70 will be turned on so that the capacitors are shorted. At all other times, when both Vout⁺ and Vout⁻ are inactive, transistors 68, 70, 72 and 74 are off.

Thus, various embodiments of a novel comparator circuit and related method have been disclosed. Although these embodiments have been described in some detail, it is to be understood that various changes can be made by those skilled in the art without departing from the spirit and scope of the invention as defined by the appended claims.

I claim:

1. A comparator circuit for comparing first and second inputs and which is operable in a sample phase and in a hold phase, said comparator circuit including:
   a first input capacitor connected to store a first voltage indicative of the first input when the comparator circuit is in the sample phase;
   a second input capacitor connected to store a voltage indicative of the second input when the comparator circuit is in the sample phase;
   an input comparator stage coupled to the first and second input capacitors and configured to switch from a measure state to one of a first and a second output states when the comparator circuit is in the hold phase based upon relative magnitudes of the first and second inputs; and
   reset circuitry configured to discharge the first and second capacitors in response to a change in the input comparator stage to one of the output states.

2. The comparator circuit of claim 1 where the input comparator stage has first and second complementary outputs when the input comparator stage is in one of the output states and wherein the comparator circuit further includes an output latch switchable to one of first and second states in response to the first and second complementary outputs of the input comparator circuit.

3. The comparator circuit of claim 2 wherein the input comparator stage includes first and second amplifiers, with the first amplifier having an input coupled to a first terminal of the first input capacitor and with the second amplifier having an input coupled to a first terminal of the second input capacitor.

4. The comparator circuit of claim 3 further including a first transistor switch connected between second terminals of the first and second input capacitors, with said first transistor switch being in an off state during the sample phase and an on state during the hold phase.

5. The comparator circuit of claim 4 wherein the reset circuitry includes a second transistor switch connected across the first input capacitor and a third transistor switch connected across the second input capacitor.

6. The comparator circuit of claim 5 wherein the second and third transistor switches are in an off state when the comparator circuit is in the sample phase and in an on state commencing after the input comparator stage changes to the output state.

7. The comparator circuit of claim 6 wherein the output latch produces a first output which is active when the output latch is in the first state and inactive when the output latch is in the second state and produces a second output which is active when the output latch is in the second state and inactive when the output latch is in the first state and wherein the second and third transistor switches are in the on state when either the first and second outputs is active.

8. The comparator circuit of claim 7 wherein the output latch is switchable to a disable state where both the first and second outputs are inactive.

9. A comparator circuit for comparing first and second input voltages including:

first and second input capacitors;

first and second feedback capacitors;

a first inverting amplifier having an input connected to a first terminal of the first input capacitor and to a first terminal of the second feedback capacitor and an output connected to a second terminal of the first feedback capacitor;

a second inverting amplifier having an input connected to a first terminal of the second input capacitor and to a first terminal of the first feedback capacitor and having an output connected to a second terminal of the second feedback capacitor;

a first transistor switch connected between a second terminal of the first input capacitor and a source of the first input voltage;

a second transistor switch connected between a second terminal of the second input capacitor and a source of the second input voltage;

a third transistor switch connected between the second terminals of the first and second input capacitors;

timing control circuitry configured to generate timing signals which operate to switch the first and second transistor switches to an on state during a sample phase and to switch the third transistor switch to an on state during a hold phase subsequent to the sample phase; and reset circuitry configured discharge the first and second input capacitors during the hold phase, independent of the timing control circuitry.

10. The comparator circuit of claim 9 wherein the reset circuitry initiates the discharge in response to a change in the outputs of the first and second inverting amplifiers.

11. The comparator circuit of claim 10 wherein the reset circuitry includes a fourth transistor switch connected between the first and second terminals of the first input capacitor and a fifth transistor switch connected between the first and second terminals of the second input capacitor.

12. The comparator circuit of claim 11 further including a sixth transistor switch connected between the input and output of the first inverting amplifier and a seventh transistor switch connected between the input and output of the second inverting amplifier and wherein the timing signals operate to set the sixth and seventh transistor switches to an on state during the sample phase and to set the sixth and seventh transistors to an off state during the hold phase.

13. A comparator circuit for comparing first and second input voltages including:

first and second input capacitors;

first and second feedback capacitors;

a first inverting amplifier having an input connected to a first terminal of the first input capacitor and to a first terminal of the second feedback capacitor and an output connected to a second terminal of the first feedback capacitor;

a second inverting amplifier having an input connected to a first terminal of the second input capacitor and to a first terminal of the first feedback capacitor and having an output connected to a second terminal of the second feedback capacitor;

a first transistor switch connected between the second terminal of the first input capacitor and a source of the first input voltage;

a second transistor switch connected between the second terminal of the second input capacitor and a source of the second input voltage;

a third transistor switch connected between the second terminals of the first and second input capacitors;

timing control circuitry configured to generate timing signals which operate to switch the first and second transistor switches to an on state during a sample phase and to switch the third transistor switch to an on state during a hold phase subsequent to the sample phase, with the first and second inverting amplifiers switching from a measure state to an output state during the hold phase; and reset circuitry configured discharge the first and second input capacitors in response to the first and second inverting amplifiers switching to the output state.

14. The comparator circuit of claim 13 further including an output latch switchable from a disable state to an output state in response to the first and second inverting amplifiers switching to the output state.

15. The comparator circuit of claim 14 wherein the output latch includes first and second latch outputs, both of which are inactive when the output latch is in the disable state and only one of which is active when the output latch is in the output state.

16. The comparator circuit of claim 15 wherein the reset circuitry includes a fourth transistor switch connected between the first and second terminals of the first input capacitor, a fifth transistor switch connected between the first and second terminals of the second input capacitor and logic circuitry for controlling a state of the fourth and fifth transistor switches so that the fourth and fifth transistor switches are in an on state when either the first or second latch outputs is active.

17. The comparator circuit of claim 15 wherein the reset circuitry includes fourth and fifth transistor switches connected in parallel between the first and second terminals of the first input capacitor and sixth and seventh transistor switches connected in parallel between the first and second terminals of the second input capacitors, with gates of the fourth and seventh transistor switches connected to the first latch output and with gates of the fifth and sixth transistor switches connected to the second latch output.

18. A comparator circuit for comparing first and second input voltages and which is operable in a sample phase and in a hold phase, said comparator circuit including:

a first input capacitor connected to a source of the first input voltage when the comparator circuit is in the sample phase;

a second input capacitor connected to a source of the second input voltage when the comparator circuit is in the sample phase;

an input comparator stage coupled to the first and second input capacitors and configured to switch from a measure state to an output state when the comparator circuit is in the hold phase based upon a relative magnitudes of the first and second input voltages;

a first transistor switch connected between first and second terminals of the first input capacitor;

a second transistor switch connected between first and second terminals of the second input capacitor; and reset control circuitry for causing the first and second transistor switches to switch to an on state in response to a change in the input comparator stage to the output state.

19. The comparator circuit of claim 18 further including an output latch having first and second latch outputs, with the output latch switchable between a disable state where the first and second latch outputs are inactive to an output state where one of the first and second latch outputs is in an active state, with the output latch switching to the output state in response to the input comparator stage switching from the measure state to the output state.

20. A method of controlling a comparator circuit of the type which includes first and second input capacitors having first terminals connected to respective inputs of first and second input amplifiers, said method comprising:

applying a first input voltage to a second terminal of the first input capacitor during a sample phase;

applying a second input voltage to a second terminal of the first input capacitor during the sample phase;

connecting the second terminals of the first and second input capacitors together during a hold phase;

discharging the first and second input capacitors in response to a change of the first and second input amplifiers from a measure state to an output state; and subsequent to the discharging, applying the first and second input voltages to the second terminals of the respective first and second input capacitors.

21. A comparator circuit for comparing first and second inputs and which is operable in a sample phase and in a hold phase, said comparator circuit including:

a first input capacitor connected to store a first voltage indicative of the first input when the comparator circuit is in the sample phase;

a second input capacitor connected to store a voltage indicative of the second input when the comparator circuit is in the sample phase;

an input comparator stage coupled to the first and second input capacitors and configured to switch from a measure state to one of a first and a second output states when the comparator circuit is in the hold phase based upon relative magnitudes of the first and second inputs;

a level detecting stage coupled to the input comparator stage and configured to detect when the comparator stage switches to the one of a first and second output states; and reset circuitry configured to discharge the first and second capacitors in response to the level detecting stage detecting that the comparator stage is in the one of a first and second output states.

* * * * *

UNITED STATES PATENT AND TRADEMARK OFFICE
CERTIFICATE OF CORRECTION

PATENT NO.: 6,046,612
DATED: April 4, 2000
INVENTOR(S): Robert Callaghan Taft

It is certified that an error appears in the above-identified patent and that said Letters Patent is hereby corrected as shown below:

In Col. 9, line 12, delete "first" and insert --second-- in lieu thereof.

Signed and Sealed this

Twenty-fourth Day of April, 2001

Attest:

NICHOLAS P. GODICI

Attesting Officer     Acting Director of the United States Patent and Trademark Office